(12) United States Patent  (10) Patent No.: US 7,636,240 B2
Kim  (45) Date of Patent: Dec. 22, 2009

(54) COMPUTER COOLING APPARATUS

(75) Inventor: Kyung Ho Kim, Yongin-si (KR)

(73) Assignee: LG Electronics Inc., Seoul (KR)

( * ) Notice: Subject to any disclaimer, the term of this patent is extended or adjusted under 35 U.S.C. 154(b) by 23 days.

(21) Appl. No.: 11/790,240

(22) Filed: Apr. 24, 2007

(65) Prior Publication Data

US 2007/0258208 A1  Nov. 8, 2007

(30) Foreign Application Priority Data

May 2, 2006  (KR) .................... 10-2006-0039419

(51) Int. Cl.
    *H05K 7/20*  (2006.01)
(52) U.S. Cl. ................. 361/700; 361/695; 361/697; 361/699; 174/15.2; 174/16.3; 165/80.4; 165/104.33
(58) Field of Classification Search .............. None
    See application file for complete search history.

(56) References Cited

U.S. PATENT DOCUMENTS

| 5,297,005 | A  | * | 3/1994  | Gourdine ............. 361/697 |
| 6,031,720 | A  | * | 2/2000  | Crane et al. ............. 361/695 |
| 6,779,595 | B1 | * | 8/2004  | Chiang ............. 165/104.33 |
| 6,940,716 | B1 | * | 9/2005  | Korinsky et al. ............. 361/695 |
| 6,972,950 | B1 | * | 12/2005 | Wyatt et al. ............. 361/687 |
| 7,021,368 | B2 | * | 4/2006  | Lin et al. ............. 165/104.33 |
| 7,027,299 | B2 | * | 4/2006  | Wrycraft et al. ............. 361/695 |
| 7,073,568 | B2 | * | 7/2006  | Chen et al. ............. 165/104.33 |
| 7,089,999 | B1 | * | 8/2006  | Wu et al. ............. 165/80.3 |
| 7,102,890 | B2 | * | 9/2006  | Lee et al. ............. 361/704 |
| 7,243,708 | B2 | * | 7/2007  | Lee et al. ............. 165/104.33 |
| 7,269,014 | B1 | * | 9/2007  | Zhao et al. ............. 361/700 |
| 7,363,963 | B2 | * | 4/2008  | Wang et al. ............. 165/80.3 |
| 7,382,047 | B2 | * | 6/2008  | Chen et al. ............. 257/706 |
| 7,414,841 | B2 | * | 8/2008  | Chen et al. ............. 361/697 |
| 7,467,657 | B2 | * | 12/2008 | Pawlak et al. ............. 165/80.4 |
| 2004/0080910 | A1 | * | 4/2004 | Chen ............. 361/695 |
| 2006/0028798 | A1 | * | 2/2006 | Wang ............. 361/697 |
| 2007/0119566 | A1 | * | 5/2007 | Peng ............. 165/80.3 |

* cited by examiner

*Primary Examiner*—Boris L Chervinsky
(74) *Attorney, Agent, or Firm*—Birch, Stewart, Kolasch & Birch, LLP

(57) ABSTRACT

A computer cooling apparatus is provided. The computer cooling apparatus includes a case, a fan, a CPU (central processing unit), and a heat radiating device. The case has an air outlet formed in one side. The fan is formed at another side of the case to suction external air. The CPU is installed in the case. The heat radiating device radiates heat generated from the CPU. The fan and the air outlet are formed in mutually opposite positions, and direct a flow of the external air suctioned by the fan in one direction.

25 Claims, 13 Drawing Sheets

COMPUTER COOLING APPARATUS

BACKGROUND OF THE INVENTION

1. Field of the Invention

The present invention relates to a computer cooling apparatus, and more particularly, to a personal computer cooling apparatus capable of simultaneously cooling a central processing unit (CPU) and an inside of a computer case using one fan, and improving air flow inside a computer case to increase cooling performance of other chip sets installed inside the computer case as well as the CPU.

2. Description of the Related Art

Generally, electronic equipment is usually air-cooled. This method generally uses heatsinks that are formed on a common metal plate to increase a radiating area. Today, heat pipe is widely used as a cooling device. The heat pipe radiates heat generated from a heat source to the outside.

A related art CPU generates heat of about 115 W. However, a CPU generating heat of nearly 135 W will soon be manufactured. Therefore, cooling performance of CPUs is becoming more and more important.

Because calorific values of various chip sets as well as the CPU are increasing, it is important to cool the entire inside of the computer case as well as the CPU.

FIG. 1 is a schematic perspective view illustrating a computer cooling apparatus according to the related art.

Referring to FIG. 1, a computer cooling apparatus according to the related art includes a case (not shown) including various components of a computer, a system fan (not shown) formed at one side of the case, a mainboard 1 connected to the case, a CPU 2 mounted on the mainboard 1, and a heat radiating device 3 for radiating heat generated from the CPU 2.

The heat radiating device 3 includes a plate 4 contacting an upper surface of the CPU 2 to receive the heat, a heat pipe 5 connected to the plate 4 to receive the heat, a heatsink 6 connected to the heat pipe 5 to receive the heat, and a fan 7 disposed above the heatsink 6 to radiate the heat of the heatsink 6.

Thus, the heat generated from the CPU 2 is transferred to the heatsink 6 through the plate 4 and the heat pipe 5. The heat transferred to the heatsink 6 is radiated inside the computer case by the fan 7. The heat radiated inside the computer case by the fan is radiated outside the computer by the system fan (not shown).

However, in the computer cooling apparatus according to the related art as described above, an auxiliary fan 7 for cooling the CPU 2 is used in addition to the system fan. Therefore, a vortex is generated inside the computer case due to heated air emitted by fan 7 mixing with air blown by the system fan. As a result, the heated air is not smoothly expelled from the computer case, thereby decreasing the cooling performance of not only the CPU 2, but the interior of the computer case as well.

Also, only the heated air inside the computer case is expelled, but other chip sets beside the CPU is not directly cooled.

In the heat radiating device 3 of the CPU according to the related art, the auxiliary fan 7 is vertically formed, increasing the size of the computer body.

The auxiliary fan 7 that is used for cooling the CPU 2 increases production cost.

SUMMARY OF THE INVENTION

Accordingly, the present invention is directed to an air conditioner that substantially obviates one or more problems due to limitations and disadvantages of the related art.

An object of the present invention is to provide a computer cooling apparatus for simultaneously cooling a CPU and an inside of a computer case using one fan to improve cooling performance and reduce production cost.

Another object of the present invention is to provide a computer cooling apparatus in which air inside computer case flows in one direction to smoothly expel the air from inside.

A further object of the present invention is to provide a computer cooling apparatus for simultaneously cooling other chip sets inside a computer case as well as a CPU improve cooling efficiency in a process of expelling heated air from inside the computer case to the outside.

A further object of the present invention is to provide a computer cooling apparatus with improved configurations of a heat pipe and a heatsink formed above a CPU to smoothly transfer air to all the heatsinks using one fan.

A still further object of the present invention to provide a computer cooling apparatus increasing a condensation region of a heat pipe to improve cooling performance of a CPU.

An even further object of the present invention is to provide a computer cooling apparatus that does not use a separate system fan for the CPU to lower the height of the cooling apparatus and slim the body of the computer case.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a computer cooling apparatus including: a case with an air outlet formed in one side; a fan formed at another side of the case for suctioning external air; a CPU (central processing unit) installed in the case; and a heat radiating device for radiating heat generated from the CPU, wherein the fan and the air outlet are formed in mutually opposite positions, for directing a flow of the external air suctioned by the fan in one direction.

In another aspect of the present invention, there is provided a computer cooling apparatus including: a case; a CPU (central processing unit) installed in the case; a heat radiating device including a plurality of heat pipes of which at least a portion contacts the CPU, and a heatsink through which at least a portion of the heat pipes passes, for receiving heat transferred from the heat pipes; and a fan formed at one side of the case for suctioning external air.

In a further aspect of the present invention, there is provided a computer cooling apparatus including: a case; a CPU (central processing unit) installed in the case; a plurality of heat pipes, of which at least a portion directly or indirectly contacts the CPU; a plurality of heatsinks, of which at least a portion contacts the heat pipes to receive heat transferred from the heat pipes, and having at least a portion that is cut away or recessed for admitting air from a sides of the heatsinks; and a fan formed at one side of the case, for allowing external air to flow between the heatsinks.

In a computer cooling apparatus according to the present invention, the inside of a computer case and the CPU are simultaneously cooled using one fan to improve cooling performance.

Also, production cost is reduced using only one fan.

Air inside the computer case flows in one direction using the one fan to smoothly expel the internal heated air to the outside.

Configurations of a heat pipe and a heatsink formed above the CPU are improved to smoothly transfer air to entire heatsinks using one fan, and a condensation region of the heat pipe is increased to improve cooling performance of the CPU.

An auxiliary fan separately used for a CPU is not used so that the height of the cooling apparatus is lowered the body of the computer case is slimmed.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
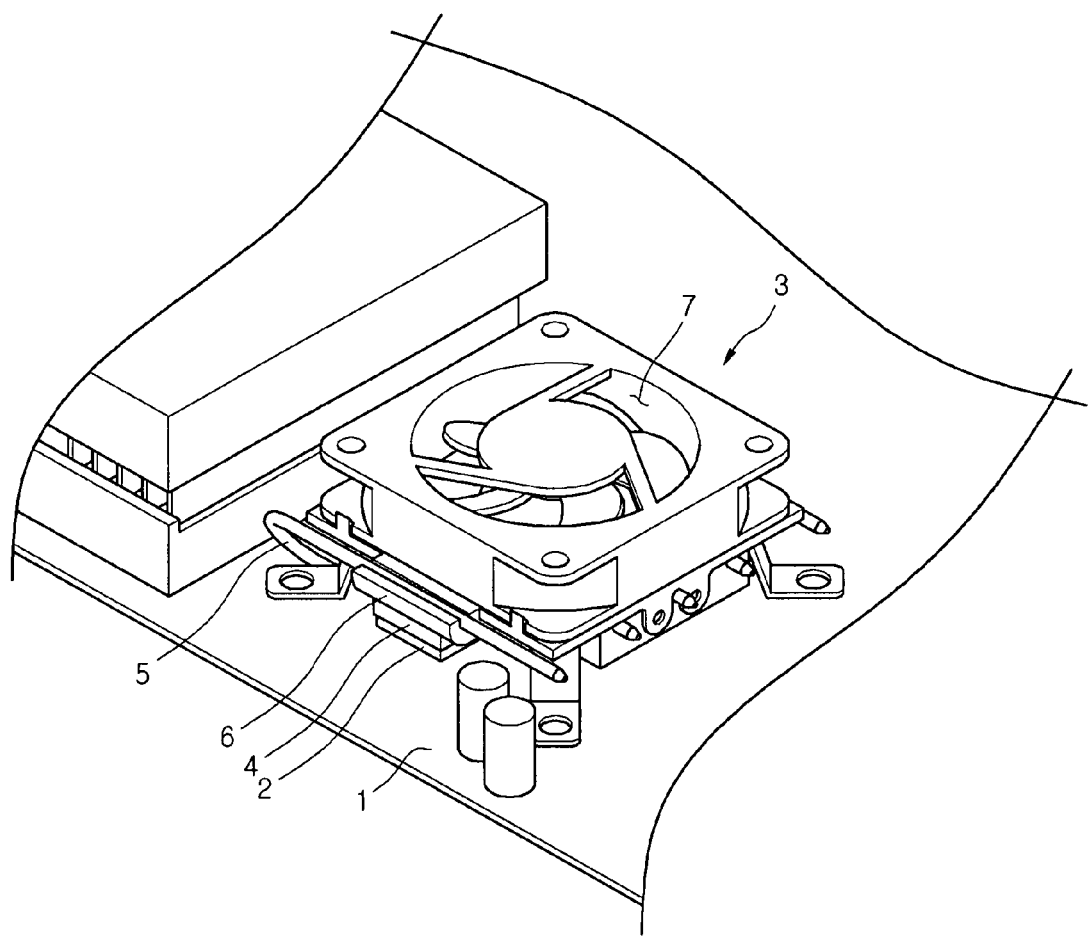
FIG. 1 is a schematic perspective view illustrating a computer cooling apparatus according to the related art.
Figure 2:
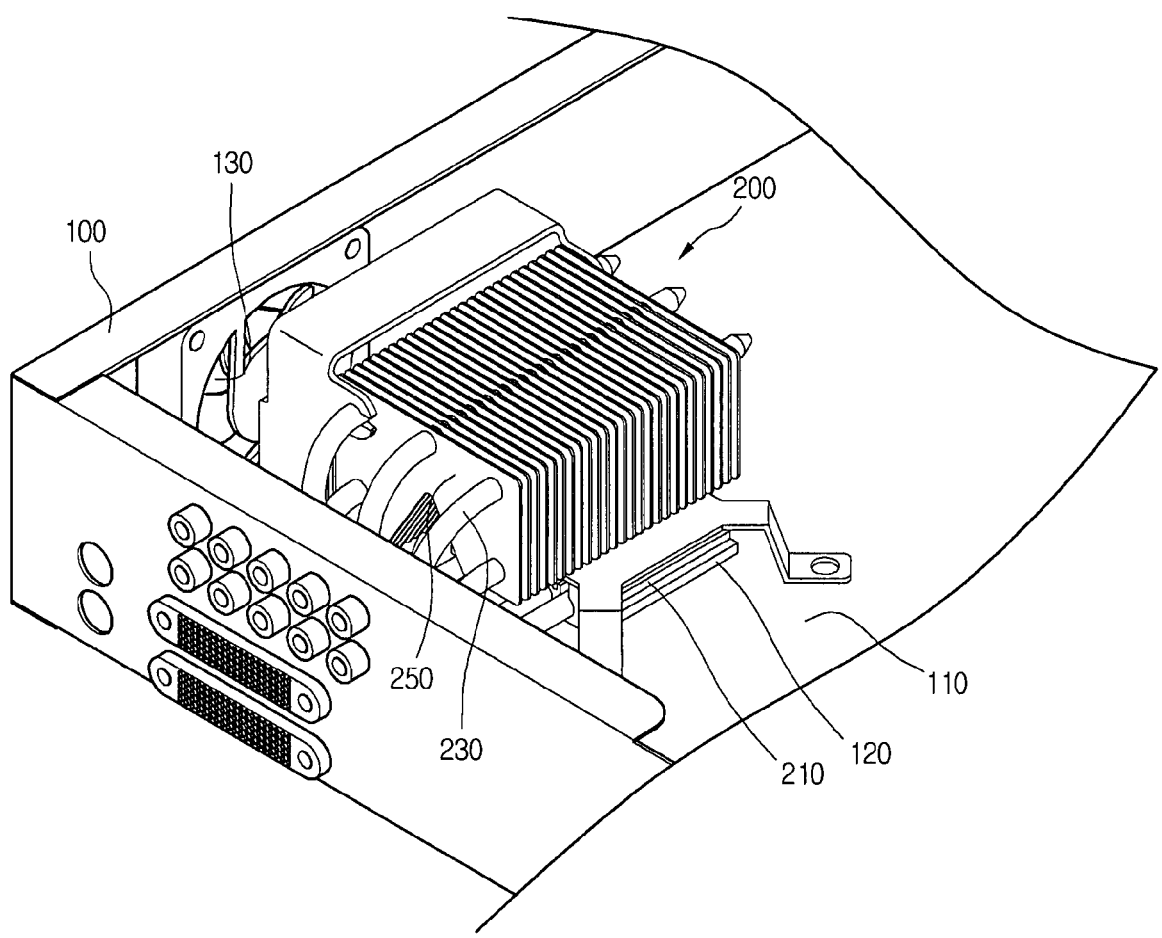
FIG. 2 is a schematic perspective view illustrating a computer cooling apparatus according to the present invention.

FIG. 2 is a schematic perspective view illustrating a computer cooling apparatus according to the present invention.

Referring to FIG. 2, the computer cooling apparatus according to the present invention includes a case 100 connected to each of computer components, a mainboard 110 placed in the case 100, a heat-radiating device 200 for radiating heat generated from a CPU 120, and fan 130 formed on one side of the case 100.

In addition, the heat-radiating device 200 includes a plate 210 mounted on the CPU 120, a plurality of heat pipes 230 connected to an upper side of the plate 210, and a plurality of heatsinks 250 connected to the heat pipes 230. In such a combination as described above, the heat generated form the CPU 120 is transferred to the plate 210 and then to the heat pipes 230. The heat transferred to the heat pipes 230 is transferred to the heatsinks 250. The heat transferred to the heatsinks 250 is radiated to the outside air by means of the fan 130.

Air outside the case 100 flows into the case 100 by the fan 130. The suctioned air passes through the heat-radiating device 200. That is, the air outside the case 100 flows into the case 100 to cool other heat-generating components including the CPU 120.

The heatsinks 250 are disposed parallel to a flow direction of the air generated by the fan 130 so as to not interrupt the flow of the air suctioned by the fan 130. The heatsinks 250 are arranged with a predetermined distance therebetween. The external air flows through spaces between each of the heatsinks 250.

The external air suctioned by the fan 130 flows between the plurality of heatsinks 250 to cool the heatsinks 250 and the heat pipes 230. The air flowing between the heatsinks 250 flows in a forward direction to cool the other heat-generating components such as a chip set and then is radiated to the outside.

Figure 3:
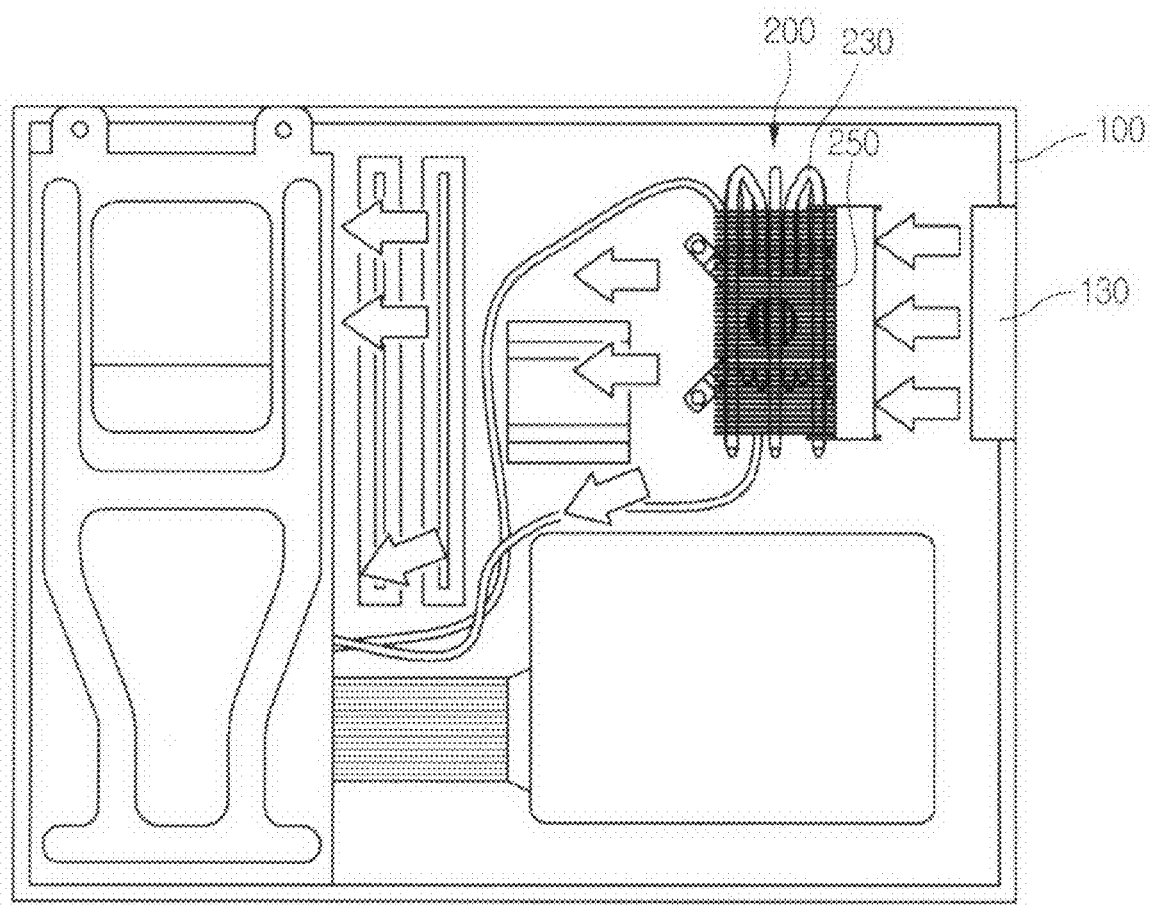
FIG. 3 is a plan view illustrating a flow of air suctioned by a fan in a computer body according to the present invention.

FIG. 3 is a plan view illustrating a flow of air suctioned by a fan in a computer body according to the present invention.

Referring to FIG. 3, arrows indicate air flow. Air suctioned from the outside using the fan flows through spaces between a plurality of heatsinks 250 to cool heat pipes 230 and heatsinks 250 which are formed at an upper portion of the heat-radiating device 200. The air passing between the plurality of heatsinks 250 flows in a forward direction to cool the entire inside of the computer case 100.

That is, the air cooling the heat pipes 230 and the heatsinks 250 flows in the one direction to cool other chip sets coupled to a computer system board. The air heated by flowing along the inside of the computer case 100 flows in the forward direction to be smoothly discharged to the outside without remaining inside the computer. Preferably, an air vent is formed at an end of the air flow path to rapidly exhaust the air heated by heat-exchange into the outside.

Figure 4:
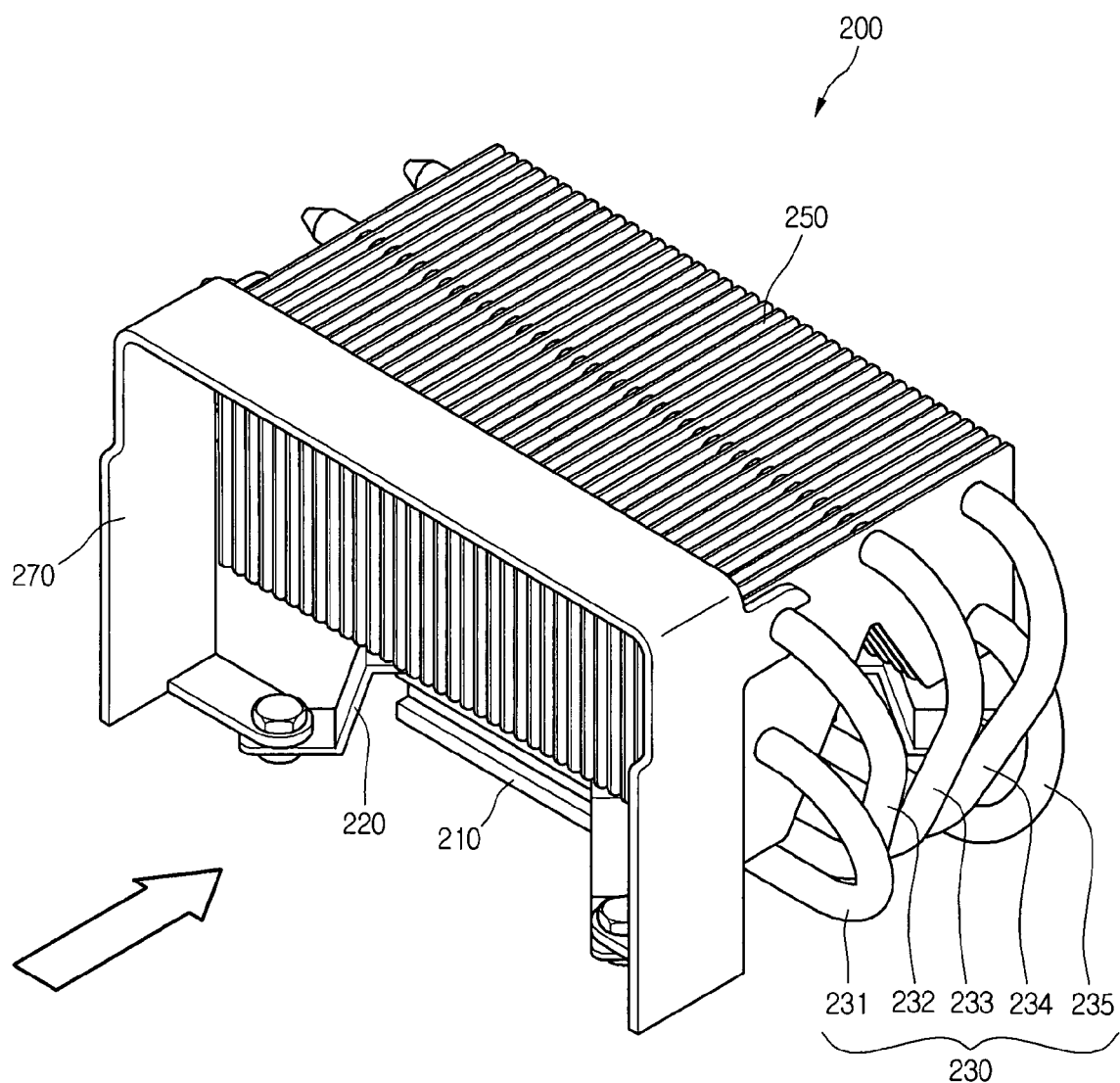
FIG. 4 is a perspective view of a heat-radiating device of a CPU according to a preferred embodiment the present invention.

FIG. 4 is a perspective view of a heat-radiating device of a CPU according to a preferred embodiment the present invention.

Arrows illustrated in FIG. 4 indicate a flow direction of air suctioned from an outside to an inside of a computer using a fan 130.

Referring to FIG. 4, the heat-radiating device 120 of the CPU according to the present invention includes a plate 210 mounted on the CPU 120 to receive heat generated from the CPU 120, a plate fixing unit 220 for fixing the plate 210, a plurality of heat pipes 230 connected to the plate 210 to receive heat transferred from the plate 210, a plurality of heatsinks 250 connected to the heat pipes 230 to receive heat transferred from the heat pipes 230, and a heat pipe fixing unit 270 for fixing the heat pipes 230.

In detail, it is preferable that the plate 210 is made of a metal material with high thermal conductivity so that the heat generated from the CPU 120 is rapidly transferred, and at the same time, the heat received from the CPU 120 is rapidly transferred to the heat pipes 250.

The heat pipes 230 are closed cylindrical pipes in which liquid refrigerant is charged. The closed cylindrical pipes are curved in a "⊃"-shape. The refrigerant injected inside the heat pipes 230 gathers in a lower horizontal portion of the heat pipes 230 because of gravity. Lower portions of the heat pipes 230 are connected to the plate 210 and upper portions of the heat pipes 230 are connected to the heatsinks 250.

Thus, the lower portions of the heat pipes 230 are received from the plate 210 and the upper portions of the heat pipes 230 are received from the heatsinks 250. That is, the heat pipes 230 transfer the heat generated from the CPU 120 to the heatsinks 250.

Although five heat pipes 231, 232, 233, 234, and 235 are installed in the embodiments, the present invention is not limited thereto. Therefore, an appropriate number of heat pipes may be installed according to the amount of heat generated form the CPU 120.

The heatsinks 250 are made of metal plates with a predetermined thickness and thermal conductivity. Preferably, the heatsinks 250 are disposed paralled to a flow direction of air generated by the fan 130 so as to not interrupt a flow of air suctioned by the fan 130.

Hereinafter, the cooling of the CPU 120 will be described in detail.

The heat generated from the CPU 120 is transferred to the plate 210 and the heat received into the plate is transferred to the lower portions of the heat pipes 230. The refrigerant stored in the lower portions of the heat pipes 230 by the gravity is evaporated by absorbing the heat transferred from the plate 210. The evaporated refrigerant rises to the upper portions of the heat pipes 230. The refrigerant moving to the upper portions of the heat pipes 230 is heat exchanged with the air suctioned by the fan 130 to condense the vapor into liquid refrigerant. That is, the refrigerant and the air are heat exchanged by thermal conduction through surfaces of the heat pipes 230. The liquified refrigerant again descends into the lower portions of the heat pipes 230 through gravity. Therefore, an evaporation process and a liquefaction process of the refrigerant injected into the heat pipes 230 are repeatedly performed to perform heat exchange. This heat exchange method has a higher heat transfer rate than that of only a metal material.

The heatsinks 250 are made of metal plates with a wide surface. Therefore, the heat transferred from the upper portions of the heat pipes 230 is rapidly radiated into the external air suctioned by the fan 130.

The air suctioned by the fan 130 flows between the heatsinks 250. Thus, the air is directly heat exchanged with the heat pipes 230, and at the same time, indirectly heat exchanged by the heatsinks 250. Therefore, cooling performance of the CPU 120 is improved.

Figure 5:
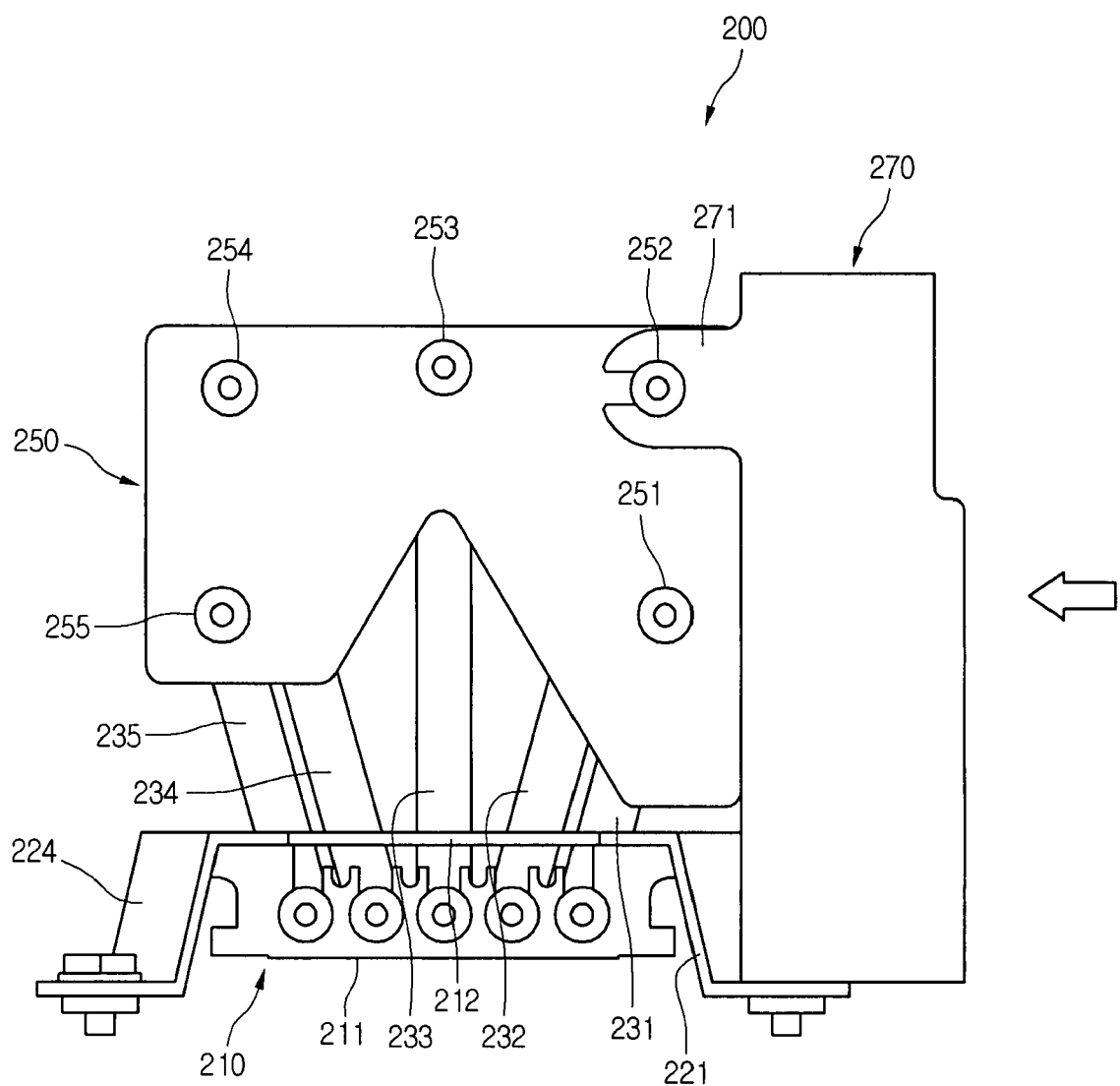
FIG. 5 is a left side view of a heat-radiating device according to the present invention.
Figure 6:
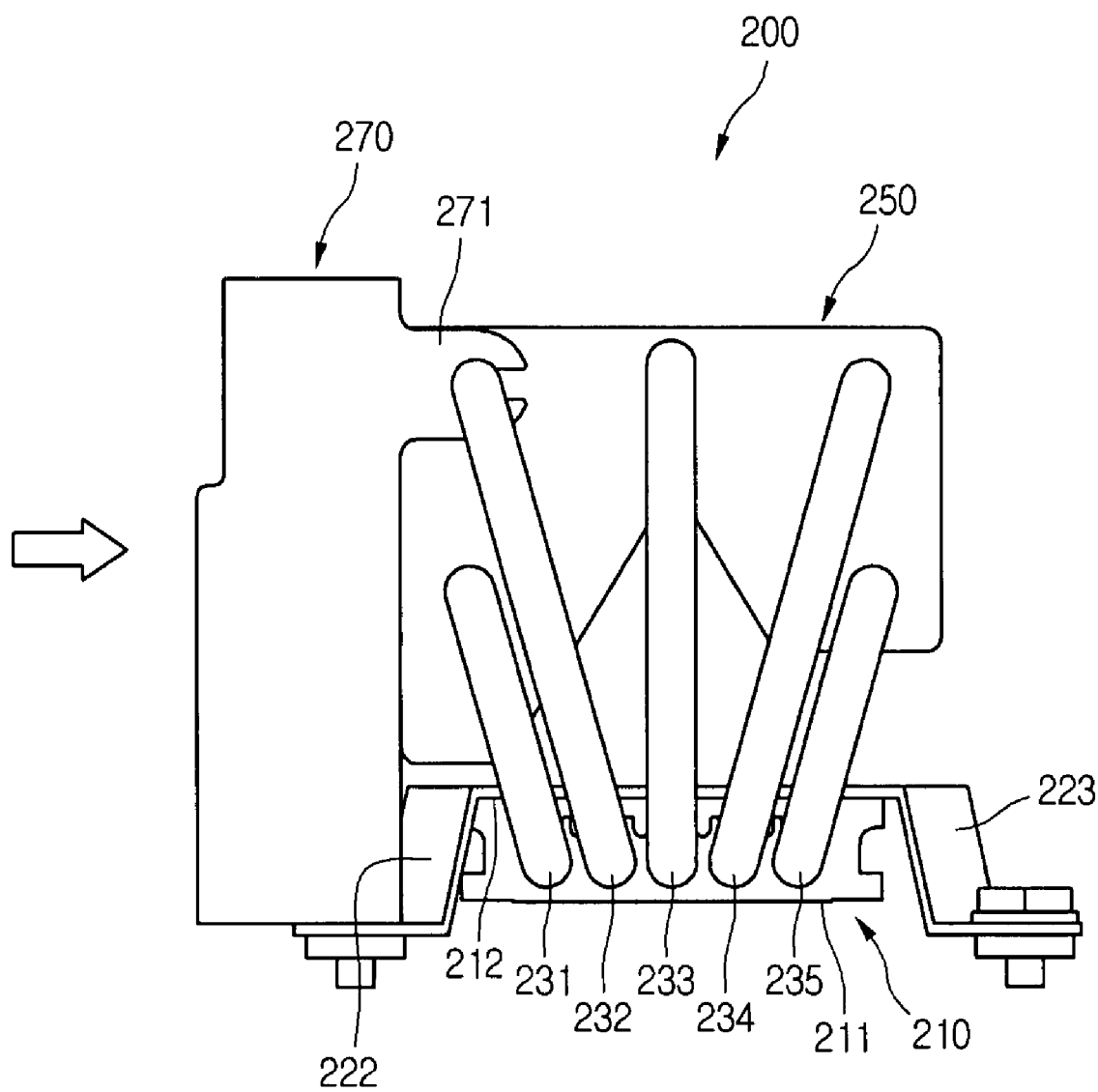
FIG. 6 is a right side view of a heat-radiating device according to the present invention.
Figure 7:
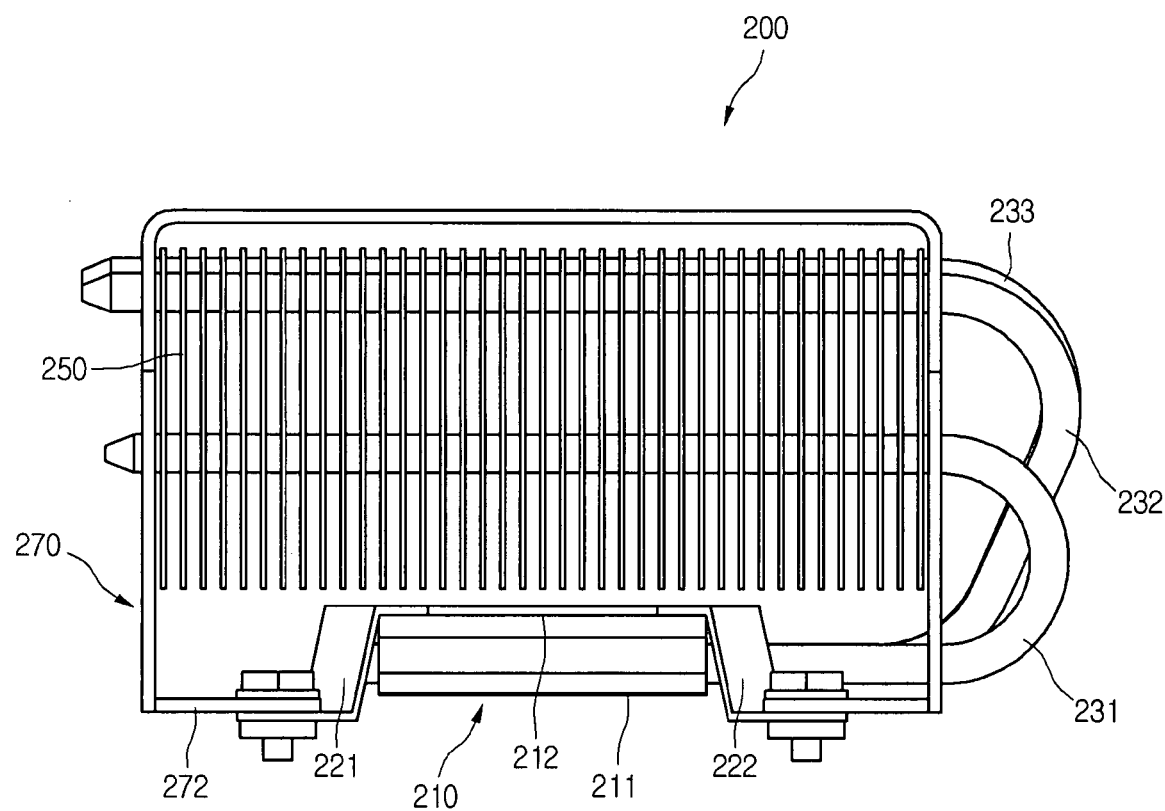
FIG. 7 is a front view of a heat-radiating device according to the present invention.
Figure 8:
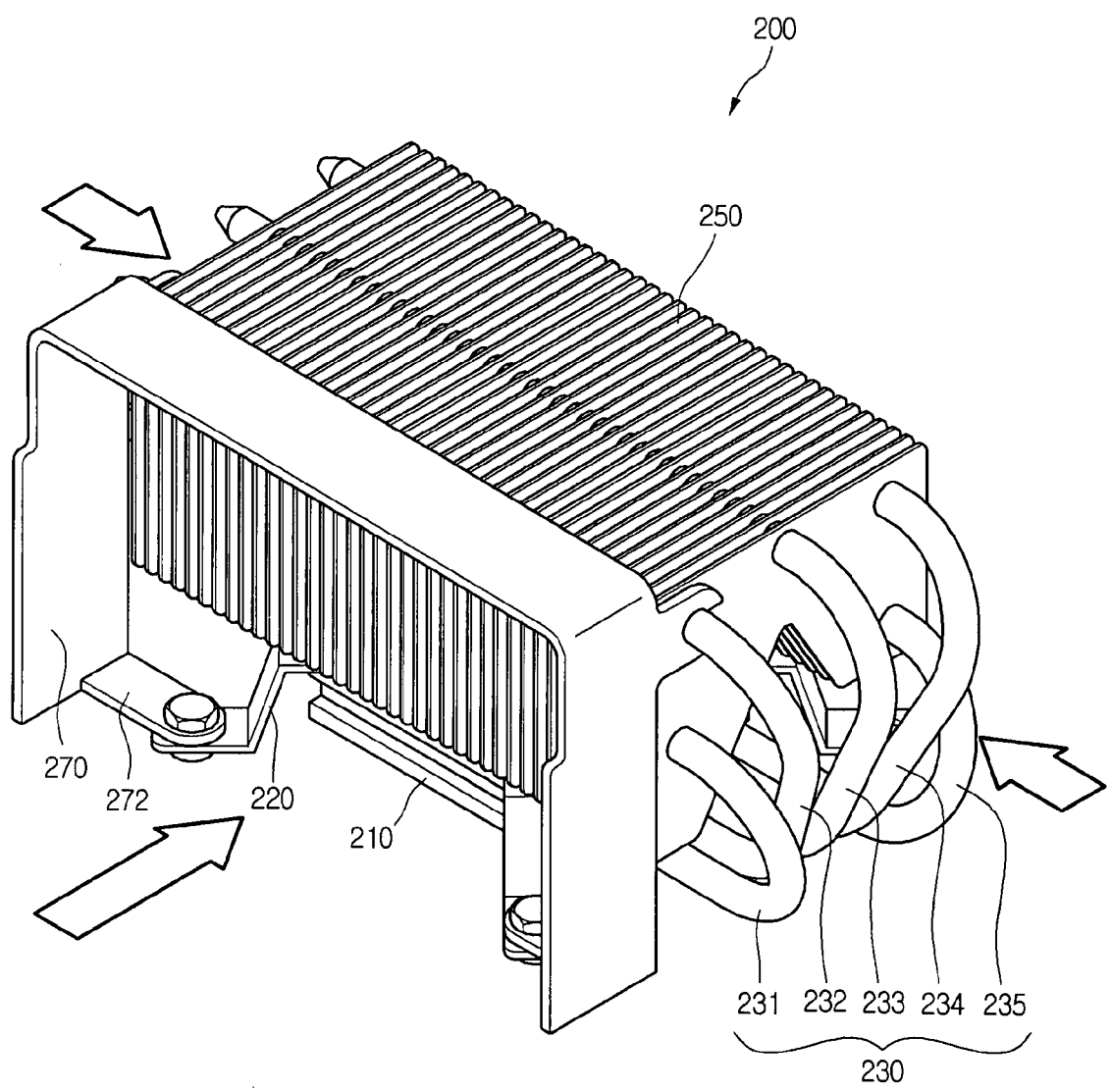
FIG. 8 is a perspective view illustrating an air flow through a heat-radiating device according to the present invention.

FIG. 5 is a left side view of a heat-radiating device according to the present invention, FIG. 6 is a right side view of the heat-radiating device, FIG. 7 is a front view of the heat-radiating device, and FIG. 8 is a perspective view illustrating air flow through the heat-radiating device.

Arrows illustrated in FIG. 5, FIG. 6, and FIG. 7 indicate a flow direction of air suctioned from an outside to an inside of a computer using a fan 130.

Hereinafter, configurations of a plate 210, heat pipes 230, and heatsinks 250 and heat exchange processes therein will be described in detail with reference to FIG. 5 through FIG. 8.

Referring to FIG. 5 through FIG. 8, the plate 210 has a block shape with a predetermined thickness. A space is formed between a lower surface 211 and an upper surface 212. The lower surface 211 of the plate 210 contacts an upper surface of a CPU 120. Grooves (refer to FIG. 5) are formed on a left side surface of the plate 210. Lower portions of the heat pipes 230 are fixedly fitted in the grooves. A plurality of holes are defined in the right side surface of the plate 210. The lower portions of the heat pipes 230 pass through the holes. That is, the grooves and the holes corresponding to the number of the heat pipes 230 are formed on the left and right side surfaces of the plate 210, respectively. The lower portions of the plurality of the heat pipes 230 contact the lower surface of the plate 211.

The lower portions of the heat pipes 230 receive heat from a lower portion of the plate 210 in a state in which the lower portions are fixed by the grooves and the holes defined in the left/right side surfaces of the plate 210.

A plurality of through holes are defined in the heatsinks 250 so that the upper portions of the heat pipes 230 having a "⊃"-shape pass through the holes. In the embodiments, five through holes 251, 252, 253, 254, and 255 are defined in one heatsink 250 so that five heat pipes 230 pass through the holes, respectively.

That is, upper portions of a first heat pipe 231, a second heat pipe 232, a third heat pipe 233, a fourth heat pipe 234, and a fifth heat pipe 255 pass through a first through hole 251, a second through hole 252, a third through hole 253, a fourth through hole 254, and a fifth through hole 255, respectively.

The upper portions of the heat pipes 230 are longer than the lower portions thereof. By such a construction of the heat pipes 230, the lower portions of the heat pipes 230 that concentrically receive the heat from the plate 210 and the upper portions of the heat pipes 230 have a wider air contacting surface. Refrigerant stagnant at the upper portions of the heat pipes 230 is easily evaporated by the heat transferred from the plate 210. The evaporated refrigerant is rapidly concentrated by thermal conduction in the upper portions of the heat pipes 230 having a relatively wide surface. As a result, the heat transfer rate of the heat pipes 230 is improved, thereby improving the overall cooling performance of the heat-radiating device 200.

Meanwhile, the first and fifth through holes 251 and 255 are disposed under the second, third, and fourth through holes 252, 253, and 254. Spaces of the second, third, and fourth through holes 252, 253, and 254 are wider than that of the through holes defined in the right side surface of the plate 210. That is, the heat pipes fan out in an upward direction as illustrated in FIG. 6.

Referring to FIG. 7, air suctioned from the outside of computer to the front of the heat-radiating device 200 cools the first and second heat pipes 231 and 232 at the same time. The flowing air can easily flow between each of heat pipes because spaces between the first through fifth heat pipes 231, 232, 233, 234, and 235 are wide.

A point of the lower portions in the heatsinks 250 is sunken upwardly to a predetermined depth. The height of the front portion of the heatsinks 250 is longer than that of the rear portion.

In detail, lower sides of portions in which the third heat pipe passes through the heatsinks 250 are depressed upward.

A lower side of portions in which the fourth and fifth heat pipes 234 and 235 pass through the heatsinks 250 is short so that the lower side is separated from the plate 210 with a predetermined space. Meanwhile, a lower side of portions in which the first and second heat pipes 231 and 232 pass through the heatsinks 250 is long so that the lower side is connected to the plate 210.

In a configuration of the above-described heatsinks 250, an air flow path having a triangular shape is formed under a central portion of the heatsinks 250 and also an air flow path is formed under the rear portion of the heatsinks 250.

Referring to FIG. 8, the air suctioned into the heat-radiating device 200 flows in a rear direction of the heat-radiating device 200 and absorbs heat. Air heated by the heat exchange forms an ascending air current and flows toward the upper portions of the third, fourth, and fifth heat pipes 233, 234, and 235. Thus, the third, fourth, and fifth heat pipes 233, 234, and 235 are also effectively cooled by a flow of the air suctioned by the fan 130. Therefore, a condensation region of the heat pipes 250 increases to improve a cooling effect.

Air flow passing between the heatsinks 250 will be described in detail with reference to the accompanying drawings.

TABLE 1

|  | Related Art Heatsink | Heatsink according to preferred embodiment of present invention |
|---|---|---|
| Thermal resistance | 0.304° C./W | 0.230° C./W |

According to Table 1, the cooling effect of the CPU due to the heatsink according to the present invention is readily apparent.

In the experiment of Table 1, the heatsink according to the related art has an identical rectangular shape in which a length of a front portion is equal to a length of a rear portion. Thus, the lower portion of the heatsink contacts the plate 210. The experiment is performed at an ambient temperature of 25° C. Also, the experiment is performed under the same conditions except for a different shape of the heatsink.

The thermal resistance of the Table 1 is a property which interferes with thermal conduction. When the thermal resistance value is low, the temperature rising rate is low.

As a result of the Table 1, a temperature of the CPU using the heatsink 250 according to the present invention is lower than that of the related art heatsink. For example, if the calorific value of the CPU is 100 W, the temperature of the CPU using the heatsink according to the present invention is 25° C., but the temperature of the CPU using the conventional heatsink is 30.4° C. That is, the temperature of the CPU using the heatsink according to the present invention is low by 6.6° C. compared to the temperature of the CPU using the conventional heatsink. A heatsink effect increases by using the heatsink according to the present invention. As the calorific value of the CPU increases, this temperature difference is much larger. For example, if the calorific value of the CPU is 200 W, the temperature of the CPU using the heatsink 250 according to the present invention is low by 13.2° C. compared to the temperature of the CPU using the conventional heatsink.

Therefore, the cooling performance of the CPU increases by using the heatsink according to the present invention. Although the heatsink 250 in the heat-radiating device according to the present invention is described as a preferred embodiment, the present invention is not limited thereto. Therefore, different heatsinks except for the heatsink 250 may also be described as an embodiment of the present invention.

Figure 9:
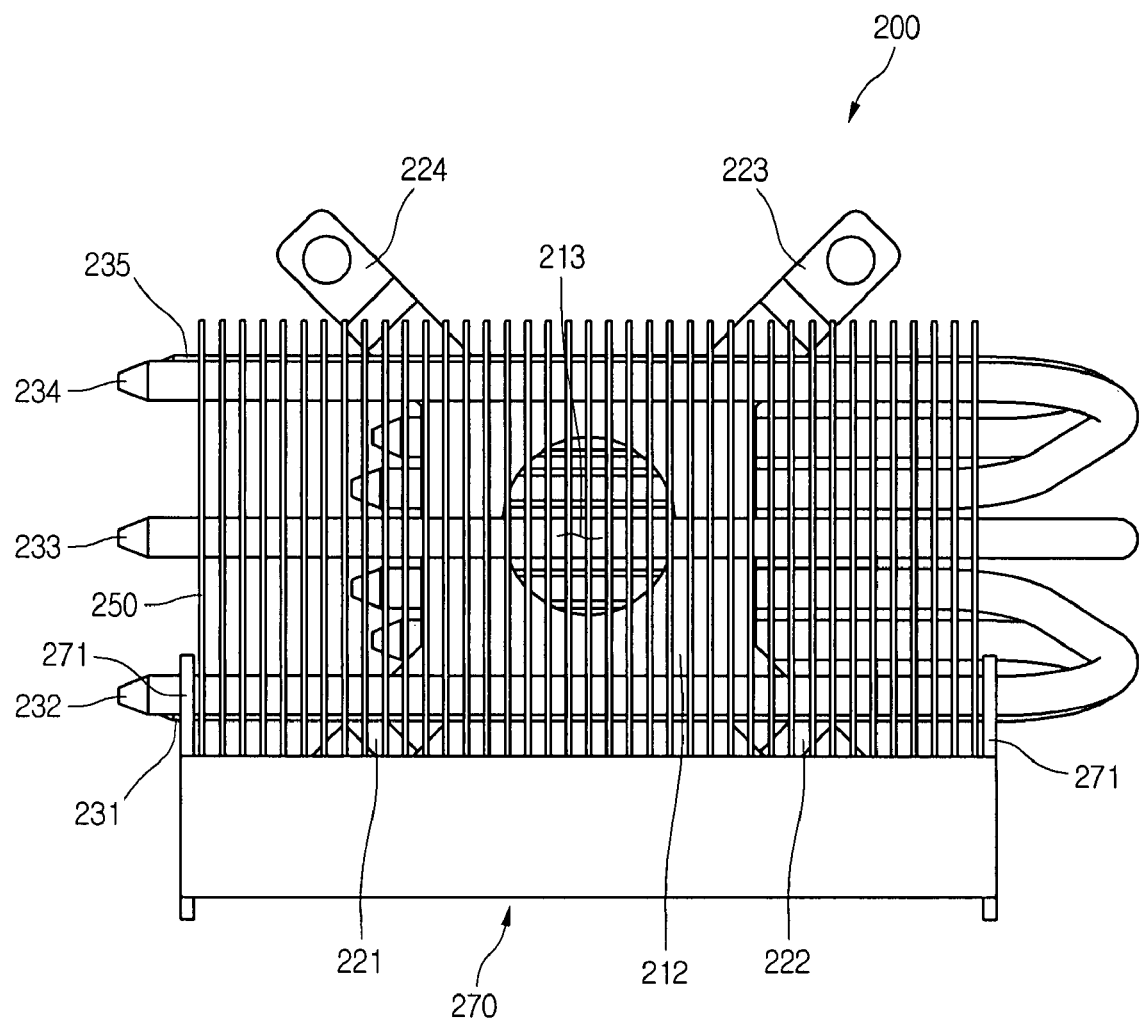
FIG. 9 is a plan view of a heat-radiating device according to the present invention.
Figure 10:
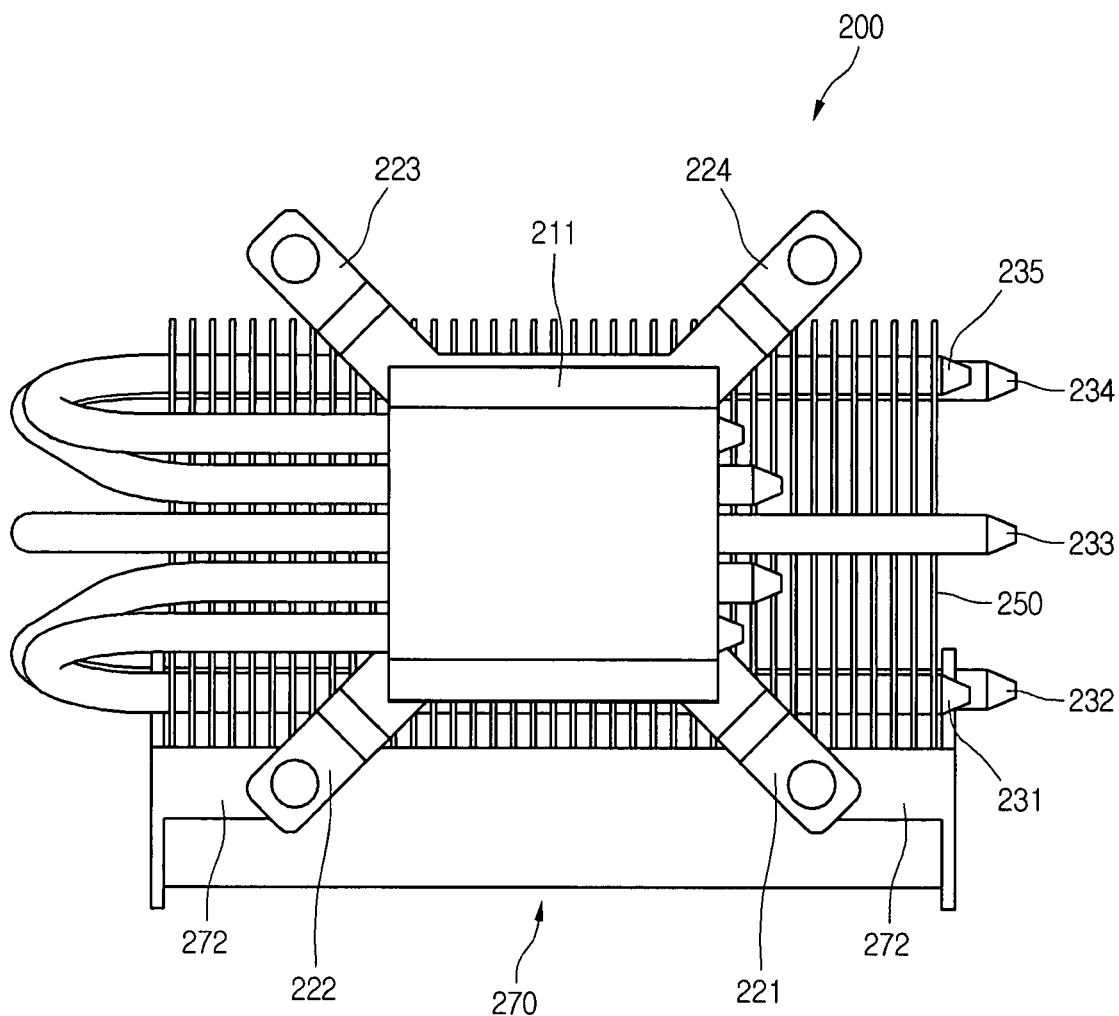
FIG. 10 is a bottom view of the heat-radiating device according to the present invention.

FIG. 9 is a plan view of a heat-radiating device according to the present invention and FIG. 10 is a bottom view of the heat-radiating device according to the present invention.

Hereinafter, a plate 210, a plate fixing unit 220, and a heat pipe fixing unit 270 will be described in detail with reference to FIG. 9 and FIG. 10.

Hereinafter, configurations of a plate 210, heat pipes 230, and heatsinks 250 and a heat exchange process therein will be described in detail with reference to FIG. 9 through FIG. 10.

Referring to FIG. 9 and FIG. 10, an entire bottom surface 211 of the plate 210 contacts an upper surface of a CPU 120. A hole 213 is defined in a central portion of an upper surface 212 of the plate 210.

Heat generated from the CPU 120 is transferred to the bottom surface 211 of the plate 210. A part of the heat transferred to the bottom surface 211 is transferred to upper portions of the heat pipes 230 and the heatsinks 250 through lower portions of the heat pipes 230. A part of the rest of the heat transferred to the bottom surface 211 is directly transferred to external air through the hole 213.

The plate fixing unit 220 includes first through fourth plate fixing units 221, 222, 223, and 224, which are formed with a step height corresponding to the thickness of the plate 210. Each of upper portions of the first through fourth plate fixing units 221, 222, 223, and 224 is screwed respectively at four apexes of the upper surface 212 of the plate 210. Lower portions of the first through fourth plate fixing units 221, 222, 223, and 224 are screwed to a bottom surface of a case 100. Therefore, the plate fixing unit 220 firmly fixes the plate 210 to the case 100.

Two protrusions 271 are protrusively formed at both sides of an upper portion of the heat pipe fixing unit 271 and two ribs 272 are protrusively formed at both sides of a lower portion (refer to FIG. 8).

In detail, a circular groove is formed on the protrusion 271. An upper portion of a second heat pipe 232 is inserted in the groove. The second heat pipe 232 is fixed by the heat pipe fixing unit 270. A heatsink in which the second heat pipe 232 passes therethrough is fixed at the second heat pipe 232. Thus, the remaining first, third, fourth, and fifth heat pipes 231, 233, 234, and 235 passing through each of heatsinks 250 are also fixed.

A hole is defined in the rib 272 and a coupling member such as a screw passes through the hole and holes defined in the lower portion of the first and second plate fixing units 221 and 222 to couple to the bottom surface of the case 100. Accordingly, the heat pipe fixing unit 220 is fixed to the bottom surface of the case 100 together with the first and second plate fixing units 221 and 222. Accordingly, fabrication is easy and cost of manufacture is reduced compared to a fabricating method according to the related art in which the heat pipe fixing unit 270 and the plate fixing units 221 and 222 are separately fixed.

In Table 1 below, effects of a heat-radiating device according to the related art and the heat-radiating device according to the present invention are more clearly compared.

TABLE 2

|  | Heat pipe | Fan | CPU power | CPU Tcase |
|---|---|---|---|---|
| Conventional Heat-radiating Device | 6Φ(five units) | 92 × 92 × 25 | 115 W | 104.63° C. |

TABLE 2-continued

|  | Heat pipe | Fan | CPU power | CPU Tcase |
|---|---|---|---|---|
| Heat-radiating Device According to Present Invention | 6Φ(five units) | 80 × 80 × 20 | 115 W | 66.82° C. |

In the experiment of Table 2, the heat pipes have an identical size, and an identical number of the heat pipes are used. Also, the calorific value of the CPUs is identical. However, the capacity of a fan that is used in the heat-radiating device according to the related art is much larger than that of the fan that is used in the heat-radiating device according to the present invention.

As shown in Table 2, although a fan having low capacity in comparison with the fan according to the related art is used, a CPU surface temperature of the heat-radiating device according to the present invention is much lower than that of the related art heat-radiating device. The heat-radiating device according to the present invention is superior to the heat-radiating device according to the related art.

Figure 11:
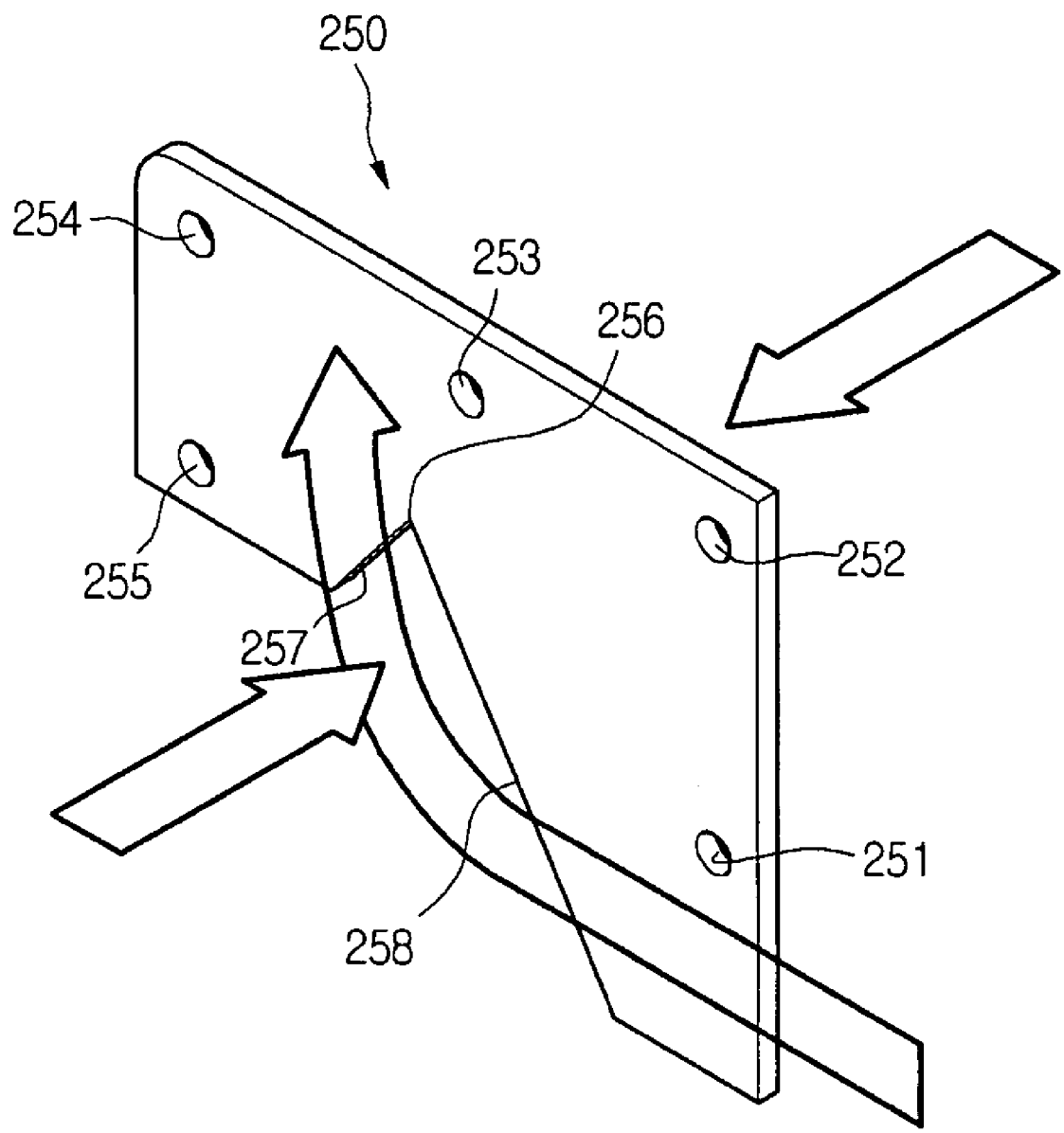
FIG. 11 is a schematic perspective view illustrating air flowing around a heatsink according to a first embodiment of the present invention.

FIG. 11 is a schematic perspective view illustrating air flowing around a heatsink according to a first embodiment of the present invention.

Referring to FIG. 11, a plurality of through holes 251, 252, 253, 254, and 255 are defined at predetermined points in a heatsink 250 according to the present invention. A recess 256 depressed in an upper direction is formed at a lower portion of the heatsink 250.

In the heatsink, an vertical length of a front portion is longer than that of a rear portion. The recess 256 is formed by a front inclined plane 258, which is inclined from a front lower portion rearward with a predetermined angle and a rear inclined plane 257, which is inclined from a rear lower portion frontward with a predetermined angle.

External air suctioned from a front of the heat-radiating device 200 absorbs heat transferred from the CPU to increase in temperature. As described above, an ascending air current is formed in the rear of the heatsink 250 because the air becomes lighter as the temperature increases. Preferably, the rear inclined plane 257 is inclined to intersect with the ascending air current, thereby increasing a heat exchanging area.

Pressure in a lower space of the heatsink 250 is less than that of a surrounding space because the external air flows toward the rear of the heatsink 250, and the heated air ascends. As a result, air having relatively low temperature, which is distributed around the heat-radiating device gathers from a central direction to both sides of the heat-radiating device. The heat generated from the CPU is rapidly radiated to improve cooling efficiency.

As described in the heatsink according to the present invention, the length of a rear lower portion of the heatsink is shorter than that of the front lower portion of the heatsink so as to not interrupt a flow of air suctioned from both sides.

Figure 12:
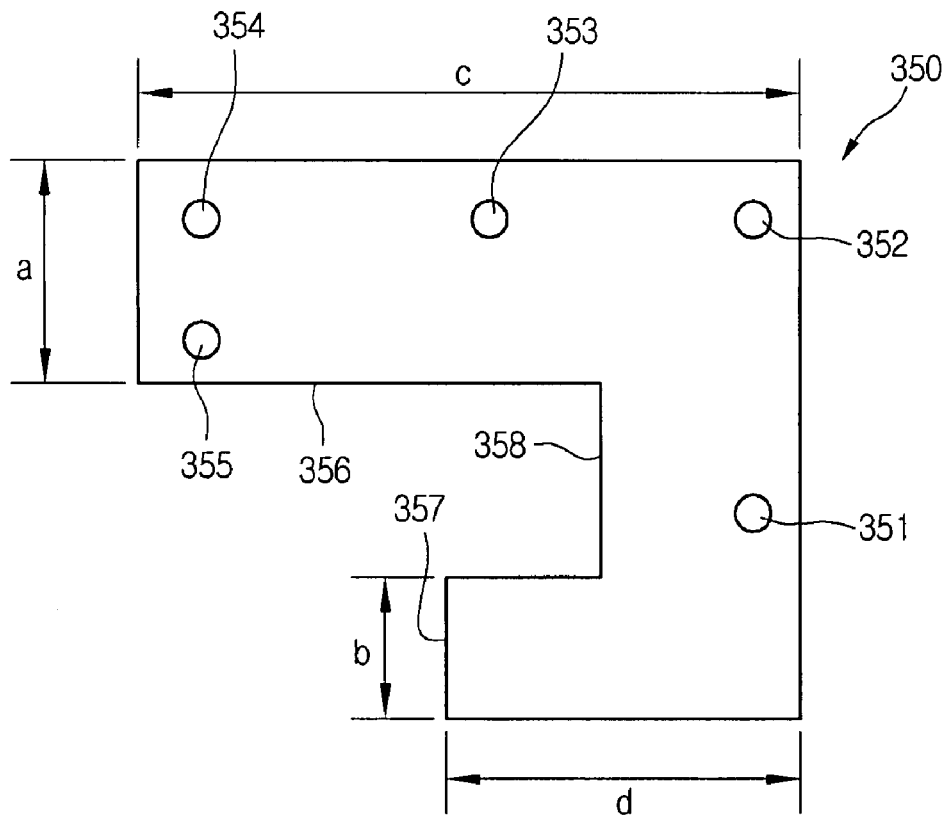
FIG. 12 is a left side view of a heatsink according to a second embodiment of the present invention.

FIG. 12 is a left side view of a heatsink according to a second embodiment of the present invention.

Referring to FIG. 12, the heatsink 350 according to the second embodiment of the present invention is bent a plurality of times.

A plurality of through holes 351, 352, 353, 354, and 355 for passing a heat pipe through as in the first embodiment are defined in the heatsink 350. The heatsink 350 includes a major portion 356 of a predetermined length extending in a front to rear direction and a minor portion 357 extending in a front to rear direction under the major portion 356. The minor portion 357 is shorter than the major portion 356. A recess 358 is formed between the major portion 356 and the minor portion 357.

External air suctioned from the front of the heatsink 350 moves to the rear of the heatsink 350 and absorbs heat. Therefore, the heated air ascends. Also, the heated air is suctioned from both sides of the heatsink 350 through a recess 358. That is, the recess 358 is a path that can smoothly suction air from both sides of the heatsink 350.

A front-to-rear length (c) of the major portion 356 is longer than a front-to-rear length (d) of the minor portion 357, thereby increasing a contact area between the air ascending by evaporation and the heatsink 350.

A vertical length (a) of the major portion 356 is longer than a vertical length (b) of the minor portion 357, thereby increasing the contact area between the air and the heatsink 350.

Figure 13:
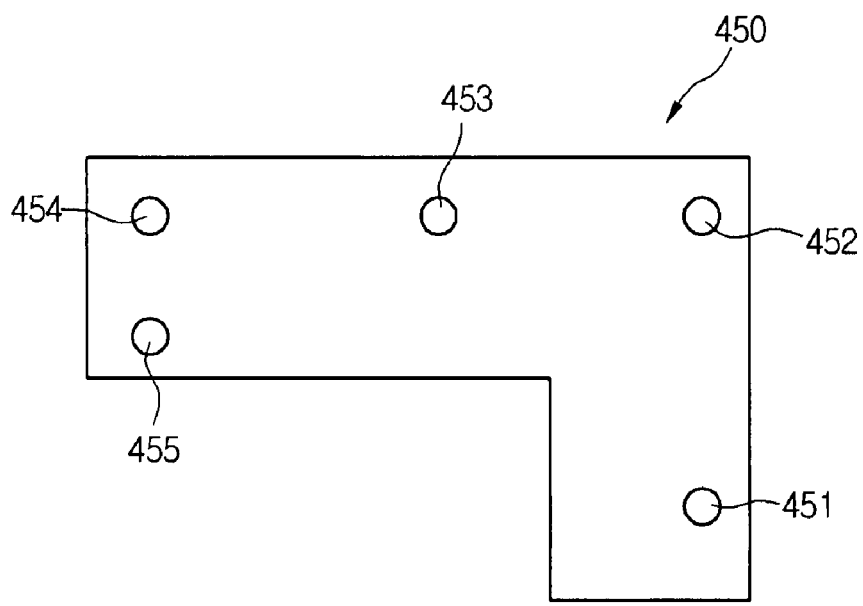
FIG. 13 is a left side view of a heatsink according to a third embodiment of the present invention.

FIG. 13 is a left side view of a heatsink according to a third embodiment of the present invention.

Referring to FIG. 13, the heatsink 450 according to the third embodiment of the present invention has an "L"-shape.

A plurality of through holes 451, 452, 453, 454, and 455 for passing a heat pipe through are defined in the heatsink 450. A part of a lower portion of the heatsink 450 is sectioned to easily suction air from both sides of the heatsink 450.

An area of the sectioned region becomes larger to minimize flow resistance of air suctioned from both sides of the heatsink 450.

Figure 14:
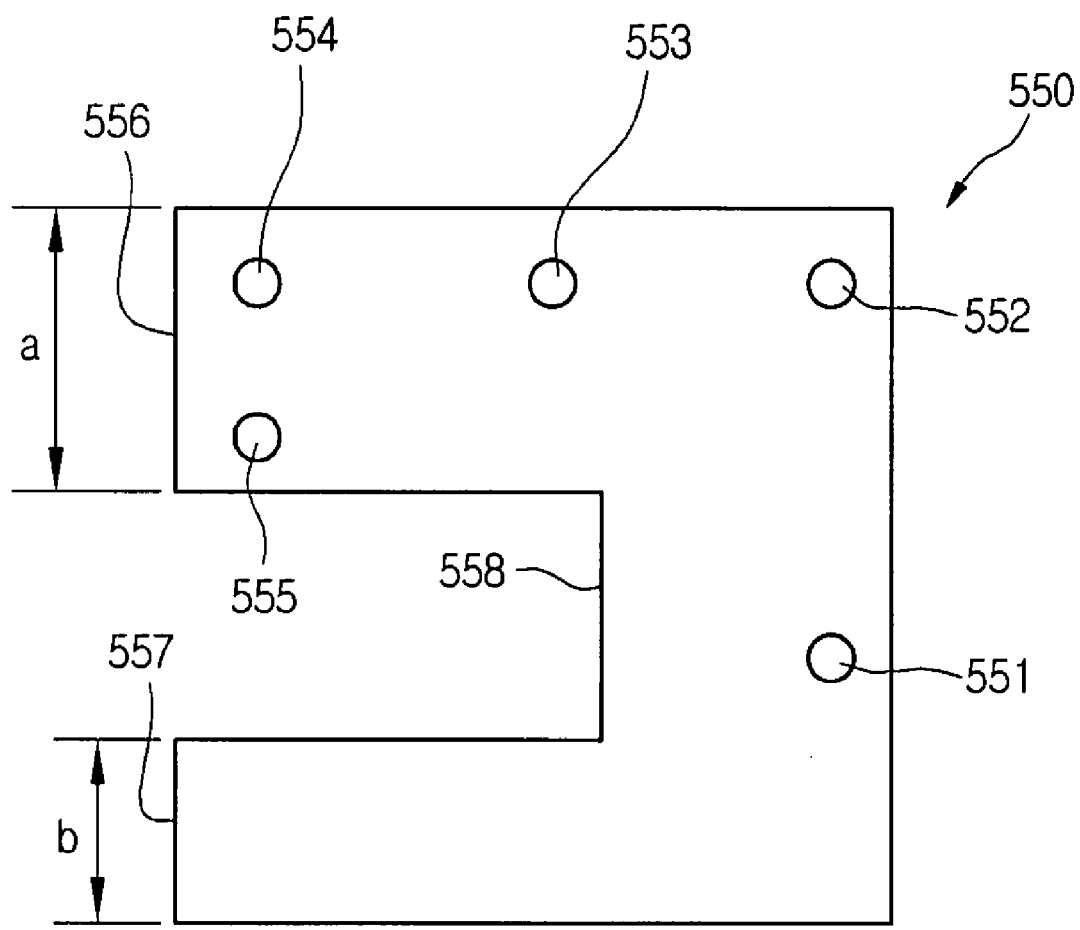
FIG. 14 is a left side view of a heatsink according to a fourth embodiment of the present invention.

FIG. 14 is a left side view of a heatsink according to a fourth embodiment of the present invention.

Referring to FIG. 14, the heatsink 550 according to the fourth embodiment of the present invention has a "U"-shape bent toward the right.

The heatsink 550 includes an upper section 556 and a lower section 557. The upper section 556 extends in a front-to-rear direction by a predetermined length. The lower section 557 is separated from the upper section 556 to a lower portion and extends in the front-to-rear direction. A plurality of through holes 551, 552, 554, and 555 for passing a heat pipe through are defined in the heatsink 550, as in the first through third embodiments. A length of the lower section 557 is equal to a length of the upper section 556. Also, a width of the upper section 556 is larger than that of the lower section 557, thereby increasing a heat exchange area between the suctioned air and the heatsink 550. The lower section 557 and the upper section 556 extend by an equal length, thereby increasing heat transfer from a plate 220.

A recess 558 is formed between the upper section 556 and the lower section 557 to smoothly suction external air from both sides of the heatsink 550. The reason that air is suctioned from both sides of the heatsink 550 is omitted because it is described above.

The invention may be embodied in many different forms and should not be construed as being limited to the embodiments set forth herein; rather, these embodiments are provided so that this disclosure will be thorough and complete, and will fully convey the concept of the invention to those skilled in the art.

What is claimed is:

1. A computer cooling apparatus comprising:
 a case with an air outlet formed in one side;
 a CPU (central processing unit) installed in the case;
 a fan attached at another side of the case for suctioning external air toward the CPU, one side of the fan being exposed to an outside of the case to suction the external air directly from the outside of the case; and a heat radiating device for radiating heat generated from the CPU, the heat radiating device including,
a plurality of heat pipes contacting the CPU, and
a heatsink through which at least a portion of each of the heat pipes passes for receiving a transfer of heat from the heat pipes, the heatsink being substantially aligned with the fan such that the fan blows the external air directly towards the heatsink,
wherein the fan and the air outlet are formed in mutually opposite positions, for directing a flow of the external air suctioned by the fan in one direction, and
wherein the fan and the heat radiating device are formed without any structure impeding a direct air flow between the fan and the heat radiating device such that the external air flows directly from the fan to the heat radiating device,
wherein a portion of the heatsink away from the fan is shorter to be further spaced apart from the CPU than a portion of the heatsink near the fan, and
wherein the heatsink includes a plurality of heatsink plates arranged at a predetermined distance from one another, and the heatsink plates do not directly contact one another.

2. The computer cooling apparatus according to claim 1, wherein
the plurality of heat pipes have curved shapes such that at least a portion of the heat pipes contacts the CPU.

3. The computer cooling apparatus according to claim 2, wherein the heat pipes ate at least partially curved in different curvatures.

4. The computer cooling apparatus according to claim 1, wherein gaps between upper portions of the heat pipes are different from gaps between lower portions of the heat pipes.

5. The computer cooling apparatus according to claim 1, wherein lengths of upper portions of the heat pipes passing through the heatsink are different from lengths of lower portions of the heat pipes receiving the heat transferred from the CPU.

6. The computer cooling apparatus according to claim 1, wherein the heatsink has a plurality of heatsink plates arranged at a predetermined distance from one another, and a lower end of the heatsink is recessed a predetermined depth.

7. The computer cooling apparatus according to claim 1, wherein the heatsink has a front vertical length greater than a rear vertical length thereof.

8. The computer cooling apparatus according to claim 1, wherein the heatsink has a U-shape or an L-shape.

9. The computer cooling apparatus according to claim 1, wherein the air outlet is located on a case at an opposite portion from a location of the fan such that the external air flows from the outside of the case through the case via fan towards the air outlet in a substantially linear direction.

10. A computer cooling apparatus comprising:
a case;
a CPU (central processing unit) installed in the case;
a heat radiating device including a plurality of heat pipes of which at least a portion contacts the CPU, a CPU plate for transferring heat generated from the CPU to the heat pipes, and a heatsink through which at least a portion of the heat pipes passes, for receiving heat transferred from the heat pipes; and
a fan attached at one side of the case for suctioning external air toward the CPU, one side of the fan being exposed to an outside of the case to suction the external air directly from the outside of the case,
wherein the fan and the heat radiating device are formed without any structure impeding a direct air flow between the fan and the heat radiating device such that the external air flows directly from the fan to the heat radiating device, and
wherein the heatsink is spaced apart from the CPU plate such that the heatsink does not directly contact the CPU plate,
wherein a portion of the heatsink away from the fan is shorter to be further spaced apart from the CPU than a portion of the heatsink near the fan, and
wherein the heatsink includes a plurality of heatsink plates arranged at a predetermined distance from one another, and the heatsink plates do not directly contact one another.

11. The computer cooling apparatus according to claim 10, wherein the heat pipe is curved in a " ⊃ "-shape.

12. The computer cooling apparatus according to claim 11, wherein the heat pipes are curved such that gaps between lower portions thereof receiving heat from the CPU are different from gaps between upper portions thereof passing through the heatsink.

13. The computer cooling apparatus according to claim 11, wherein the heat pipes that pass through the heatsink have upper portions with respectively different heights.

14. The computer cooling apparatus according to claim 11, wherein the heat pipes have gaps therebetween at upper portions thereof wider than at lower portions thereof.

15. The computer cooling apparatus according to claim 10, wherein the heat radiating device further comprises a heat pipe fixing unit for fixing at least one of the heat pipes.

16. The computer cooling apparatus according to claim 10, further comprising an air outlet provided at one side of the case, for directing a flow of the external air suctioned by the fan in one direction within the case.

17. The computer cooling apparatus according to claim 10, wherein the beat radiating device further comprises:
a plate fixing unit for fixing the CPU plate.

18. The computer cooling apparatus according to claim 10, wherein the air outlet is located on a case at an opposite portion from a location of the fan such that to external air flows from the outside of the case through the case via fan towards the air outlet in a substantially linear direction.

19. A computer cooling apparatus comprising:
a case;
a CPU (central processing unit) installed in the case;
a plurality of heat pipes, of which at least a portion directly or indirectly contacts the CPU;
a plurality of heatsinks, of which at least a portion contacts the heat pipes to receive heat transferred from the heat pipes, and having at least a recess portion that is cut away or recessed for admitting air from sides of the heatsinks between the heatsinks and the CPU, an opening of the recess portion facing the CPU; and
a fan formed at one side of the case, for allowing external air to flow between the heatsinks, one side of the fan being exposed to an outside of the case to suction the external air directly from the outside of the case,
wherein the fan and the heatsinks are formed without any structure impeding a direct air flow between the fan and the heatsinks such that the external air flows directly from the fan to the heatsinks,
wherein a portion of the heatsinks away from the fan is shorter to be further spaced apart from the CPU than a portion of the heatsinks near the fan, and
wherein each heatsink includes a plurality of heatsink plates arranged at a predetermined distance from one another, and the heatsink plates do not directly contact one another.

20. The computer cooling apparatus according to claim 19, wherein the heatsinks form recesses recessed upward from lower ends thereof, and each recess is formed with a surface inclined toward a front of the heatsinks and a surface inclined toward a rear of the heatsinks.

21. The computer cooling apparatus according to claim 19, wherein each of the heatsinks comprises:

- a body section, an upper section extending in a front-to-rear direction from one portion of the body section and a lower section extending from another portion of the body section below the upper section, and
- a recess formed between the upper section and the lower section, for allowing air to flow through sides of the heatsink.

22. The computer cooling apparatus according to claim 21, wherein a width of the upper section is greater than a width of the lower section.

23. The computer cooling apparatus according to claim 21, wherein the upper section extends an equal or greater length than the lower section.

24. The computer cooling apparatus according to claim 19, wherein the heatsinks are curved in an "L"-shape.

25. The computer cooling apparatus according to claim 19, wherein the air outlet is located on a case at an opposite portion from a location of the fan such that the external air flows from to outside of the case through the case via fan towards the air outlet in a substantially linear direction.

* * * * *